United States Patent
Fukuda et al.

(10) Patent No.: US 7,883,960 B2
(45) Date of Patent: Feb. 8, 2011

(54) METHOD OF MANUFACTURING SEMICONDUCTOR DEVICE

(75) Inventors: Masatoshi Fukuda, Kawasaki (JP); Akiyoshi Hatada, Kawasaki (JP); Katsuaki Ookoshi, Kawasaki (JP); Kenichi Okabe, Kawasaki (JP); Tomonari Yamamoto, Jhubei (TW)

(73) Assignee: Fujitsu Semiconductor Limited, Yokohama (JP)

( * ) Notice: Subject to any disclaimer, the term of this patent is extended or adjusted under 35 U.S.C. 154(b) by 128 days.

(21) Appl. No.: 12/409,979

(22) Filed: Mar. 24, 2009
(Under 37 CFR 1.47)

(65) Prior Publication Data
US 2009/0311838 A1 Dec. 17, 2009

(30) Foreign Application Priority Data
Mar. 26, 2008 (JP) ............................. 2008-080653

(51) Int. Cl.
H01L 21/8234 (2006.01)
H01L 21/8244 (2006.01)
H01L 21/8242 (2006.01)
H01L 21/336 (2006.01)

(52) U.S. Cl. ................ 438/239; 438/299; 257/E21.004; 257/E21.294

(58) Field of Classification Search ................ 438/238, 438/239, 299, 210, 649; 257/E21.59, E21.011, 257/E21.294, E21.64, E21.004
See application file for complete search history.

(56) References Cited

U.S. PATENT DOCUMENTS

| | | | | |
|---|---|---|---|---|
| 4,326,213 A * | 4/1982 | Shirai et al. | ........... | 257/528 |
| 5,321,650 A * | 6/1994 | Kikuchi et al. | ........... | 365/177 |
| 5,946,565 A * | 8/1999 | Ikeda et al. | ........... | 438/238 |
| 6,133,598 A * | 10/2000 | Lee et al. | ........... | 257/296 |
| 6,559,494 B1 * | 5/2003 | Taniguchi | ........... | 257/306 |
| 6,696,733 B2 * | 2/2004 | Koike et al. | ........... | 257/379 |
| 6,727,133 B1 * | 4/2004 | Baldwin | ........... | 438/210 |
| 6,797,554 B2 * | 9/2004 | Katayama | ........... | 438/210 |
| 7,187,594 B2 * | 3/2007 | Shibata et al. | ........... | 365/189.05 |
| 2001/0023965 A1 * | 9/2001 | Ikeda et al. | ........... | 257/368 |
| 2001/0025970 A1 * | 10/2001 | Nozaki et al. | ........... | 257/255 |
| 2004/0102003 A1 * | 5/2004 | Tran | ........... | 438/241 |
| 2005/0227440 A1 * | 10/2005 | Ema et al. | ........... | 438/275 |
| 2006/0065918 A1 * | 3/2006 | Nagano et al. | ........... | 257/296 |
| 2007/0096183 A1 * | 5/2007 | Ogawa et al. | ........... | 257/300 |

(Continued)

FOREIGN PATENT DOCUMENTS

JP 2005-79290 A 3/2005

(Continued)

*Primary Examiner*—Walter L Lindsay, Jr.
(74) *Attorney, Agent, or Firm*—Westerman, Hattori, Daniels & Adrian, LLP (57) ABSTRACT

A method of manufacturing a semiconductor device includes forming a conductive layer over a semiconductor substrate, selectively removing the conductive layer for forming a resistance element and a gate electrode, forming sidewall spacers over sidewalls of the remaining conductive layer, forming a first insulating film containing a nitrogen over the semiconductor substrate having the sidewall spacers, implanting ions in the semiconductor substrate through the first insulating film, forming a second insulating film containing a nitrogen over the first insulating film after implanting ions in the semiconductor substrate through the first insulating film, and selectively removing the first and the second insulating film such that at least a part of the first and the second insulating films is remained over the semiconductor substrate and over the conductive layer.

7 Claims, 11 Drawing Sheets

U.S. PATENT DOCUMENTS

| | | | |
|---|---|---|---|
| 2008/0079028 A1* | 4/2008 | Sel et al. | 257/211 |
| 2008/0093464 A1* | 4/2008 | Dairiki et al. | 235/492 |
| 2008/0280406 A1* | 11/2008 | Ema et al. | 438/210 |
| 2009/0311838 A1* | 12/2009 | Fukuda et al. | 438/238 |
| 2010/0013026 A1* | 1/2010 | Booth et al. | 257/379 |
| 2010/0133626 A1* | 6/2010 | Aoyama et al. | 257/379 |
| 2010/0148261 A1* | 6/2010 | Fukushima et al. | 257/349 |

FOREIGN PATENT DOCUMENTS

| | | |
|---|---|---|
| JP | 2005-223085 A | 8/2005 |
| JP | 2005-228966 A | 8/2005 |
| JP | 2006-186012 A | 7/2006 |
| JP | 2006-216615 A | 8/2006 |

* cited by examiner

METHOD OF MANUFACTURING SEMICONDUCTOR DEVICE

CROSS-REFERENCE TO RELATED APPLICATION

This application is based upon and claims the benefit of priority of the prior Japanese Patent Application No. 2008-080653 filed on Mar. 26, 2008, the entire contents of which are incorporated herein by reference.

FIELD

An aspect of the embodiments discussed herein is directed to a method of manufacturing a semiconductor device including a field-effect transistor and a resistance element.

BACKGROUND

In recent semiconductor devices, a silicidation technique has been used to reduce the resistance of gate electrodes and source and drain regions.

In the silicidation technique, silicon in a gate electrode and a source and drain region is allowed to react with a high-melting-point metal, such as cobalt or nickel, to form a metal silicide layer on the gate electrode and the source and drain region.

In some cases, in addition to a field-effect transistor, a resistance element is formed on a chip. In the formation of the resistance element, for example, a polycrystalline silicon layer is patterned on a device isolation region, such as a trench isolation region. Thus, the polycrystalline silicon layer is patterned simultaneously with the patterning of a polycrystalline silicon film in the formation of a gate electrode. However, since the polycrystalline silicon layer is used as the resistance element, no metal silicide layer is formed on the patterned polycrystalline silicon layer.

Thus, Japanese Laid-open Patent Publication No. 2005-79290 discusses a technique in which a silicide block pattern formed of a SiN film having a thickness in the range of 5 nm to 20 nm and a SiO$_2$ film having a thickness of 40 nm is formed on a metal silicide layer disposed on a polycrystalline silicon layer for use in the formation of a resistance element to prevent the formation of a silicide layer, thus providing a resistance element.

The SiN film is formed after a source and drain region is doped with an impurity. Thus, there is no block film preventing the implantation of a contaminant, an element having a large atomic weight, or a cluster ion in the impurity doping. A contaminant may therefore be implanted in the surface of a sidewall spacer. The contamination reduces the insulation resistance of a sidewall.

A natural oxidation film or a block film on a silicon substrate may be removed, for example, by wet etching using a hydrofluoric acid (HF) solution, before a high-melting-point metal is deposited on the silicon substrate to form a silicide layer. The wet etching may excessively etch the sidewall spacer. The over-etching deforms the sidewall spacer, causing lot-to-lot variations in the parasitic resistance of field-effect transistors.

Furthermore, in the wet etching, a high etch rate of the SiO$_2$ film in the silicide block may cause lot-to-lot variations in etching depth. This causes lot-to-lot variations in the formation of a region in the polycrystalline silicon layer in which the metal silicide layer is to be formed, and eventually causes lot-to-lot variations in the resistance of the resistance element.

SUMMARY

According to an aspect of an embodiment, a method of manufacturing a semiconductor device includes forming a conductive layer over a semiconductor substrate, selectively removing the conductive layer for forming a resistance element and a gate electrode, forming sidewall spacers over sidewalls of the remaining conductive layer, forming a first insulating film containing a nitrogen over the semiconductor substrate having the sidewall spacers, implanting ions in the semiconductor substrate through the first insulating film, forming a second insulating film containing a nitrogen over the first insulating film after implanting ions in the semiconductor substrate through the first insulating film, and selectively removing the first and the second insulating film such that at least a part of the first and the second insulating films is remained over the semiconductor substrate and over the conductive layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A first embodiment and a second embodiment will be described below. The present technique is not limited to these embodiments.

A process of manufacturing a semiconductor device according to a first embodiment will be described below with reference to FIGS. 1 to 5.

First, the structure of a semiconductor device 700 according to the first embodiment will be described below with reference to FIG. 5B.

The semiconductor device 700 includes, over a p-type silicon substrate 100, a metal insulator (MIS) transistor 400, a resistance element region 500, and a resistance element region 510. The MIS transistor 400 includes a polysilicon gate electrode 120 disposed over the p-type silicon substrate 100 with a gate insulating film 110 interposed therebetween. The gate electrode 120 is provided with sidewall spacers 161. Impurity regions 130 and 181 are disposed over both sides of the gate electrode 120 in the p-type silicon substrate 100. Silicide layers 210 are disposed over the gate electrode 120 and the impurity regions 181. The resistance element region 500 is disposed in the p-type silicon substrate 100. The resistance element region 510 is disposed over a device isolation region 141.

The resistance element region 500 is disposed in the p-type silicon substrate 100. A silicide block 201 is disposed over the resistance element region 500. The silicide block 201 includes silicon nitride films 171 and 191. Silicide films 210, which serve as contact regions, are disposed over both sides of the silicide block 201 in the p-type silicon substrate 100.

The resistance element region 510 is disposed over the device isolation region 141. A polysilicon pattern 150 for use in the formation of a resistance element is disposed over the device isolation region 141. The polysilicon pattern 150 is formed of polysilicon. The polysilicon pattern 150 is provided with sidewall spacers 161. A silicide block 201 is formed over the polysilicon pattern 150. The silicide block 201 includes silicon nitride films 172 and 192. Silicide films 210, which serve as contact regions, are disposed over both sides of the silicide block 201 in the polysilicon pattern 150.

FIGS. 1 to 5 illustrate a method of manufacturing the semiconductor device 700 according to the first embodiment.

Figure 1A:
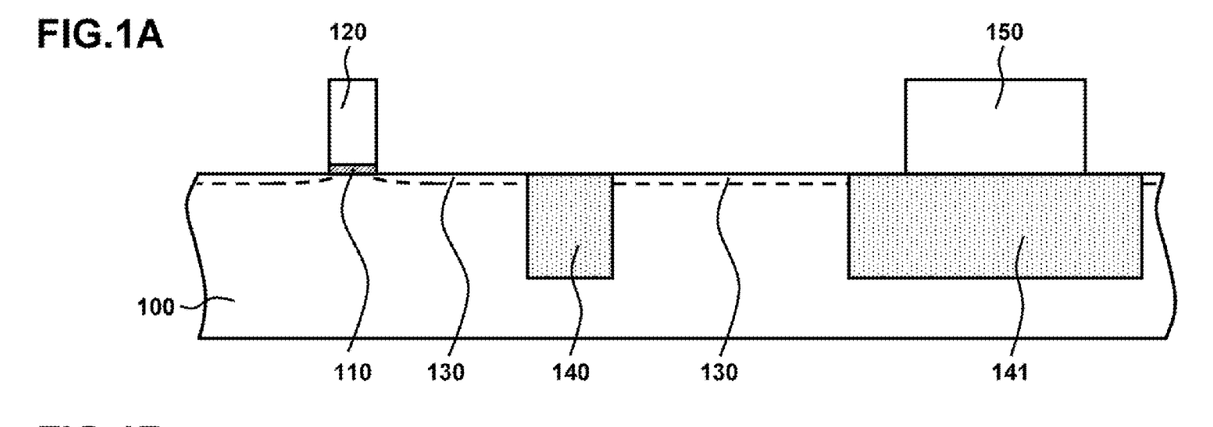
FIGS. 1A-1B are cross-sectional views illustrating a method of manufacturing an n-type MIS transistor 700 according to a first embodiment.

FIG. 1A illustrates the formation of a polysilicon pattern 120 and a polysilicon pattern 150 for use in the formation of a resistance element. Recessed portions in a p-type silicon substrate 100 are filled with an insulator to form device isolation regions 140 and 141. A gate insulating film 110, which may be a silicon oxynitride film having a thickness in the range of 1 nm to 10 nm, is formed over the p-type silicon substrate 100 by chemical vapor deposition (CVD) and thermal nitridation. A polysilicon film deposited over the gate insulating film 110 is patterned to form a polysilicon pattern 120, which is formed of a polycrystalline silicon film to form the gate electrode, and has a thickness in the range of 50 nm to 150 nm and a width in the range of 30 nm to 50 nm. A polysilicon pattern 150 for use in the formation of a resistance element is formed over the device isolation region 141. The polysilicon pattern 150 is formed of a polycrystalline silicon film. The gate insulating film 110 may be formed of an insulating material having a high dielectric constant, such as a zirconia film or a hafnium oxide film. The polysilicon pattern 150 may be formed over the device isolation region 141, or polysilicon pattern 150 may be formed over the device isolation region 141.

An impurity region 130 is formed on the p-type silicon substrate 100 by ion implantation using the polysilicon pattern 120 as a mask. For example, the impurity region 130 contains a p-type impurity at a concentration of $1 \times 10^{20}$ cm$^{-3}$. The impurity region 130 is formed over the entire surface of the p-type silicon substrate 100 except the device isolation regions 140 and 141. Resist masks may be formed over a resistance element region 500 and a resistance element region 510 so that the impurity region 130 is not formed thereon.

Figure 1B:
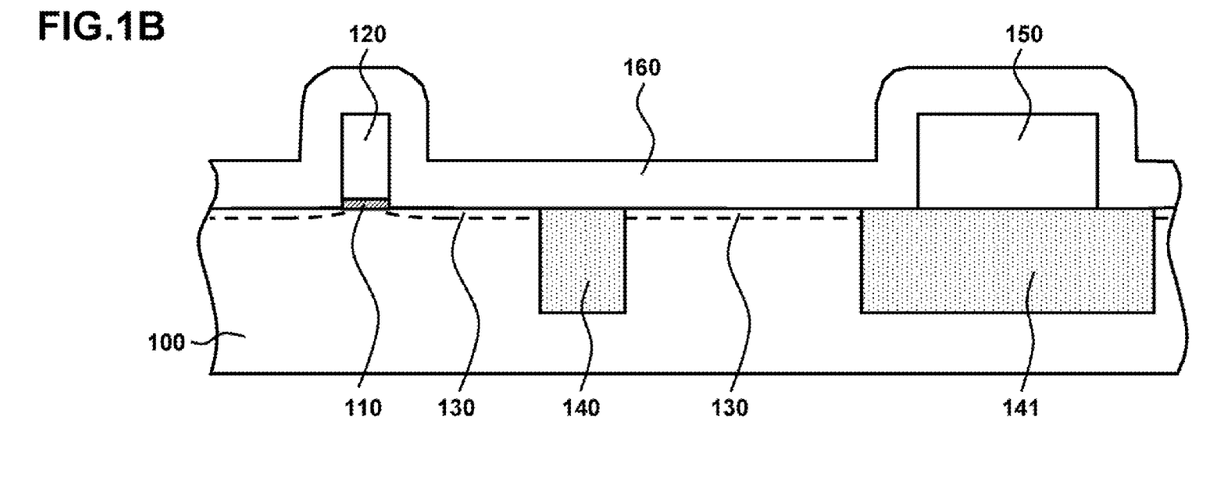

FIG. 1B illustrates the formation of a silicon oxide film 160 over the entire surface of the p-type silicon substrate 100. The silicon oxide film 160 has a thickness in the range of 50 nm to 150 nm. The silicon oxide film 160 may be formed by CVD.

Figure 2A:
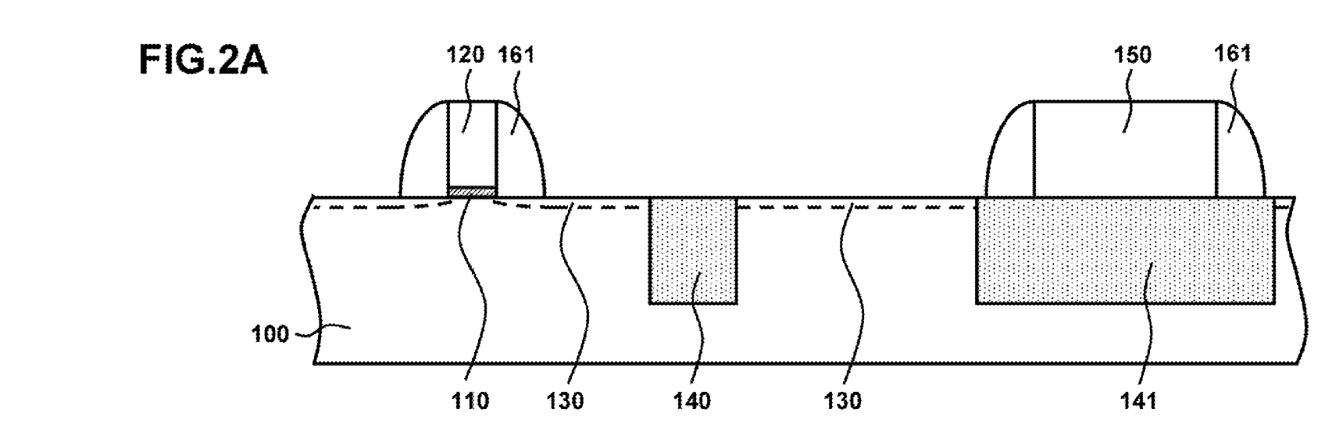
FIGS. 2A-2B are cross-sectional views illustrating a method of manufacturing an n-type MIS transistor 700 according to the first embodiment.

FIG. 2A illustrates the formation of sidewall spacers 161 over the sides of the polysilicon pattern 120 and the polysilicon pattern 150. The sidewall spacers 161 are formed by anisotropically etching the silicon oxide film 160. The sidewall spacers 161 have a width in the range of 50 nm to 70 nm.

Figure 2B:
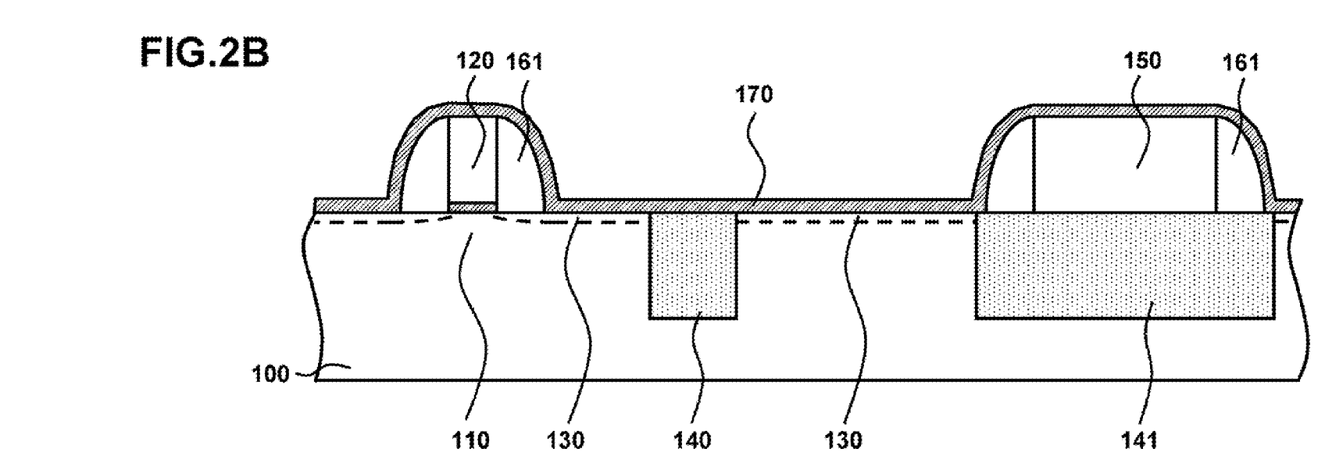

FIG. 2B illustrates the formation of a silicon nitride film 170 over the p-type silicon substrate 100 having the sidewall spacers 161 over the sides of the polysilicon pattern 120 and the polysilicon pattern 150. Preferably, the silicon nitride film 170 is formed by atomic layer deposition (ALD) using dichlorosilane ($SiH_2Cl_2$) and an ammonia gas at a temperature of 500° C. or less so that the impurity region 130 is not diffused. The silicon nitride film 170 may be used as a protective filter layer in impurity doping, as described below. The protective filter layer prevents the implantation of a contaminant, for example, formed of carbon, an element having a large atomic weight, or a cluster ion in the impurity doping. Preferably, the silicon nitride film 170 has a thickness in the range of 1 nm to 5 nm. The silicon nitride film 170 having a thickness below 1 nm may not prevent the implantation of a contaminant. The silicon nitride film 170 having a thickness above 5 nm prevents not only the implantation of a contaminant but also impurity doping.

Figure 3A:
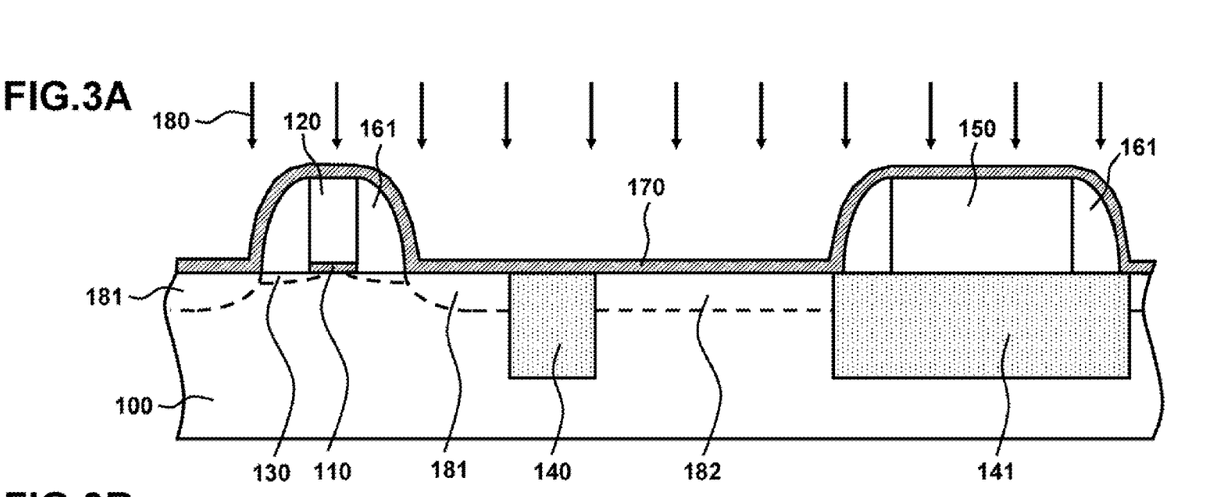
FIGS. 3A-3B are cross-sectional views illustrating a method of manufacturing an n-type MIS transistor 700 according to the first embodiment.

FIG. 3A illustrates the formation of impurity regions 181 and impurity regions 182 in the p-type silicon substrate 100 by ion implantation through the silicon nitride film 170. As indicated by an arrow 180, an n-type impurity, phosphorus or arsenic, is implanted in the p-type silicon substrate 100 using the polysilicon pattern 120 and the sidewall spacers 161 as masks to form the impurity regions 181 and impurity regions 182. In phosphorus implantation, the acceleration energy ranges from 1 keV to 10 keV, and the dose ranges from $1 \times 10^{15}$/cm$^2$ to $2 \times 10^{16}$/cm$^2$. In arsenic implantation, the acceleration energy ranges from 1 keV to 30 keV, and the dose ranges from $1 \times 10^{15}$/cm$^2$ to $2 \times 10^{16}$/cm$^2$. The impurity regions 181 and the impurity regions 182 extend 20 nm to 100 nm from the surface of the p-type silicon substrate 100.

Alternatively, the impurity regions 182 may be formed by implanting a p-type impurity boron in a region in which a resistance element is to be formed, using a resist mask formed over a region in which a MIS transistor 400 is to be formed. In the boron implantation, the acceleration energy ranges from 1 keV to 5 keV, and the dose ranges from $1 \times 10^{15}$/cm$^2$ to $5 \times 10^{15}$/cm$^2$. The depth of the impurity regions 182 ranges from 20 nm to 100 nm from the surface of the p-type silicon substrate 100.

Figure 3B:
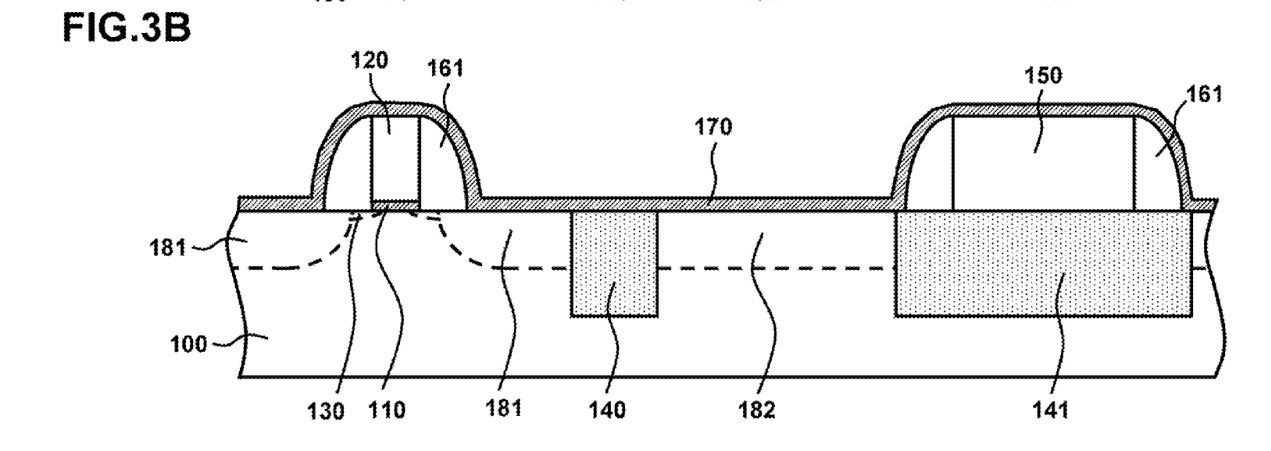

FIG. 3B illustrates the activation of the impurity in the impurity regions 181 and the impurity regions 182 by heat treatment for a short period of time. Preferably, the heat treatment is rapid thermal annealing (RTA) for about 1 second except the time required for heating to and cooling from a temperature, for example, in the range of 900° C. to 1025° C.

Figure 4A:
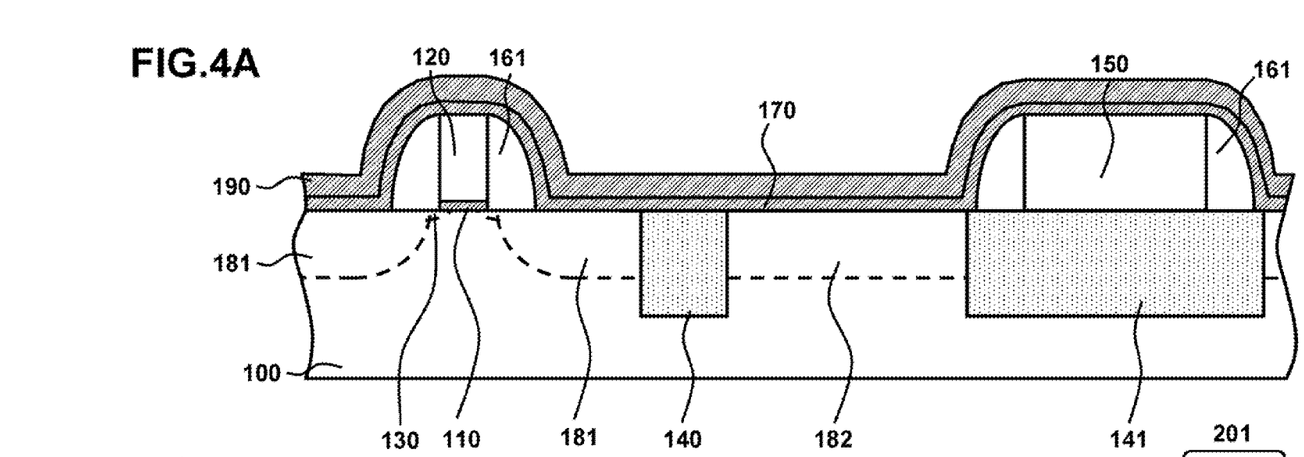
FIGS. 4A-4B are cross-sectional views illustrating a method of manufacturing an n-type MIS transistor 700 according to the first embodiment.

FIG. 4A illustrates the formation of a silicon nitride film 190 over the ion-implanted silicon nitride film 170. Preferably, the silicon nitride film 190 has a thickness in the range of 20 nm to 30 nm. Preferably, the silicon nitride film 190 is formed by ALD method using dichlorosilane ($SiH_2Cl_2$) and an ammonia gas at a temperature of 500° C. or less so that the impurity region 130 is not diffused.

Figure 4B:
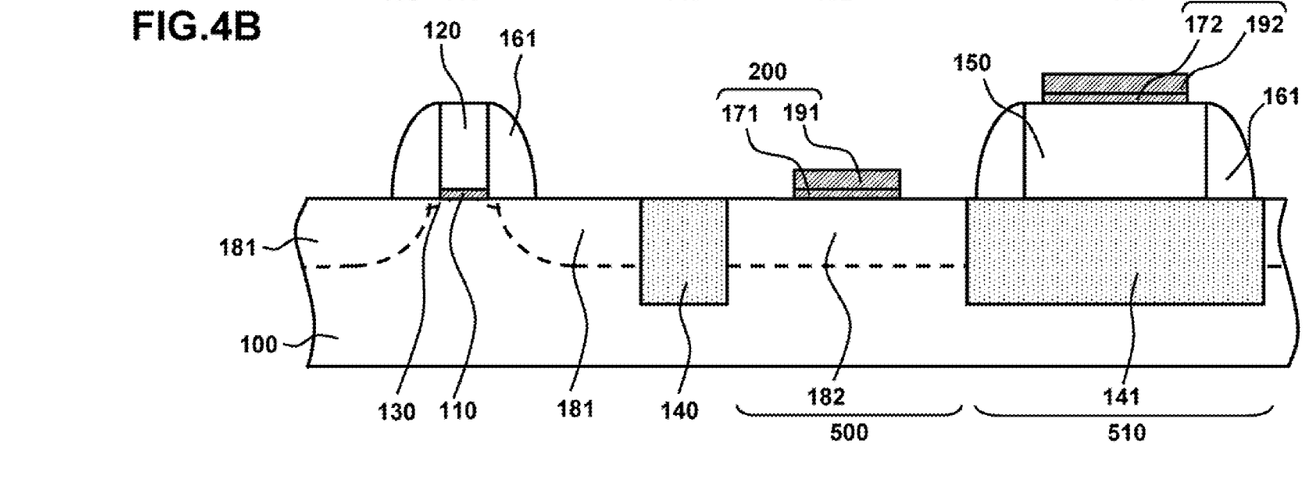

FIG. 4B illustrates the formation of a silicide block 200 over the resistance element region 500 in the p-type silicon substrate 100 and the formation of a silicide block 201 over the resistance element region 510 in the polysilicon pattern 150 for use in the formation of a resistance element. First, a photoresist (not illustrated) is formed over the silicon nitride film 190 over the resistance element region 500 in the p-type silicon substrate 100. A photoresist (not illustrated) is also formed over the silicon nitride film 190 over the resistance element region 510 in the polysilicon pattern 150. The entire surface of the silicon nitride film 170 and the silicon nitride film 190 are then anisotropically etched to form the silicide block 200 and the silicide block 201. The silicide block 200 is formed of a silicon nitride film 171 and a silicon nitride film 191. The silicide block 201 is formed of a silicon nitride film 172 and a silicon nitride film 192. The photoresists (not illustrated) are then removed from the silicide block 200 and the silicide block 201.

Preferably, the total thickness of the silicon nitride film 170 and the silicon nitride film 190 ranges from 10 nm to 35 nm. When the total film thickness is less than 10 nm, the silicide block 200 and the silicide block 201 are removed in a process for removing a natural oxide film described below. When the total film thickness is more than 35 nm, the distance between the sidewall spacers 161 is about 30 nm because of higher integration of the MIS transistor 400. Thus, in a process for removing a natural oxide film described below, even when the silicide block 200 and the silicide block 201 are etched, a region in which a contact region is to be formed may not be formed over the p-type silicon substrate 100 and over the polysilicon pattern 150 for use in the formation of a resistance element.

Figure 5A:
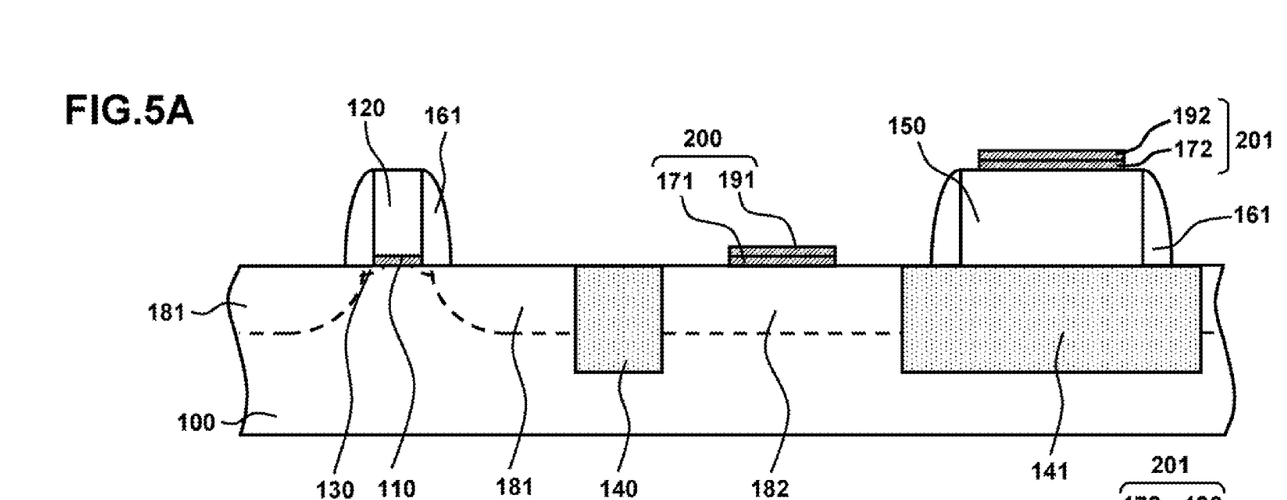
FIGS. 5A-5B are cross-sectional views illustrating a method of manufacturing an n-type MIS transistor 700 according to the first embodiment.

FIG. 5A illustrates the removal of a natural oxidation film remaining over the p-type silicon substrate 100. The surface of the p-type silicon substrate 100 is hydrogen-terminated by wet etching using a hydrofluoric acid solution.

The sidewall spacers 161, the silicide block 201, and a silicide block 202 are etched by the hydrofluoric acid solution. The ratio of the etch rate of silicon nitride, which forms the silicide block 201 and the silicide block 202, by hydrofluoric acid to the etch rate of silicon oxide, which forms the sidewall spacers 161, by hydrofluoric acid may be 1:2.5. For example, the thickness of the sidewall spacers 161 is reduced from 50 nm to 25 nm by wet etching. For example, the thickness of the silicide block 201 and the silicide block 202 is reduced from 20 nm to 10 nm by wet etching. Thus, after wet etching, the silicide block 201 and the silicide block 202, even when they have a small thickness, remain over a region in which a resistance element is to be formed in the p-type silicon substrate 100 and over a region in which a resistance element is to be formed in the polysilicon pattern 150 for use in the formation of a resistance element.

Figure 5B:
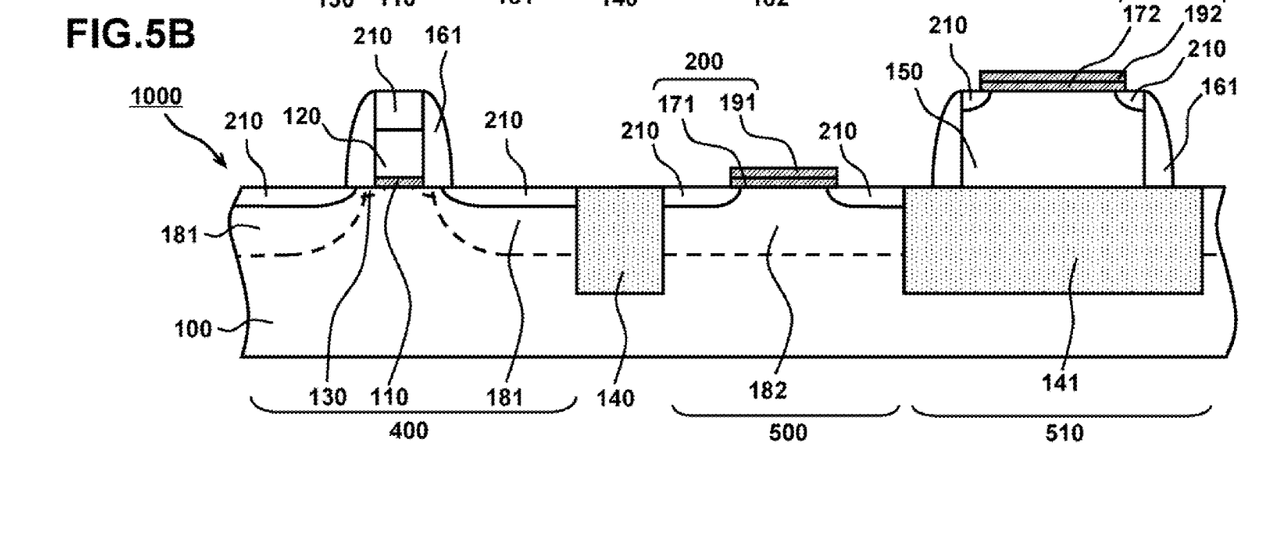

FIG. 5B illustrates the formation of silicide layers 210 over the polysilicon pattern 120, as the gate electrode 120, over the p-type silicon substrate 100, and over regions in which a contact region is to be formed in the resistance element region 510.

For example, a cobalt film having a thickness of 8 nm is formed over the entire surface of the p-type silicon substrate 100 and is heat-treated at a temperature of 450° C. for 30 seconds. Unreacted cobalt is then removed. Thus, the silicide layers 210 are formed over the gate electrode 120 and the impurity regions 181. In the same manner, the silicide layers 210 are formed over regions in which a contact region is to be formed in the polysilicon pattern 150 for use in the formation of a resistance element. Nickel may be used in place of cobalt.

A contact etch stop layer (CESL) (not illustrated), for example, formed of a silicon nitride film and an interlayer insulating film (not illustrated) are then deposited. The CESL controls etching over the silicide layers. After the interlayer insulating film is planarized, contact holes and contact plugs are formed. A wiring layer is then formed. Through these processes, the semiconductor device 700 is completed.

In the semiconductor device 700 according to the first embodiment, impurity doping is performed through the first insulating film, that is, the silicon nitride film 171. This prevents a contaminant from entering the sidewall spacers 161. Furthermore, the silicon nitride film 171 and the silicon nitride film 191 are layered to form the silicide block 200 and the silicide block 201. This eliminates the need for removing the silicon nitride film 171 before removing a natural oxidation film, thus preventing the reduction in the thickness of the sidewall spacers 161. This prevents lot-to-lot variations in the parasitic resistance of a field-effect transistor. Furthermore, in the process for removing a natural oxide film, SiN forming the silicide block 201 has higher etch resistance than $SiO_2$. Thus, the width of the silicide block 201 may be appropriately controlled. A method of manufacturing a semiconductor device according to the first embodiment may therefore reduce lot-to-lot variations in the resistance of a resistance element.

A process of manufacturing a semiconductor device 701 according to a second embodiment will be described below with reference to FIGS. 6 to 11.

First, the structure of a semiconductor device 701 according to the second embodiment will be described below with reference to FIG. 11B. The same components as in the first embodiment are denoted by the same reference numerals and will not be further described.

The semiconductor device 701 includes, over a p-type silicon substrate 100, a MIS transistor 401, a resistance element region 500, and a resistance element region 511. The MIS transistor 401 includes L-shaped first sidewall spacers 221 and second sidewall spacers 231 over both sides of a gate electrode 120. The first sidewall spacers 221 are formed of silicon oxide. The second sidewall spacers 231 are formed of silicon nitride.

A resistance element region 511 is disposed over a device isolation region 141. A polysilicon pattern 150 for use in the formation of a resistance element is provided with L-shaped first sidewall spacers 221 and second sidewall spacers 231 over both sides thereof. The first sidewall spacers 221 are formed of silicon oxide. The second sidewall spacers 231 are formed of silicon nitride.

FIGS. 6 to 11 illustrate a method of manufacturing the semiconductor device 701 according to the second embodiment.

Figure 6A:
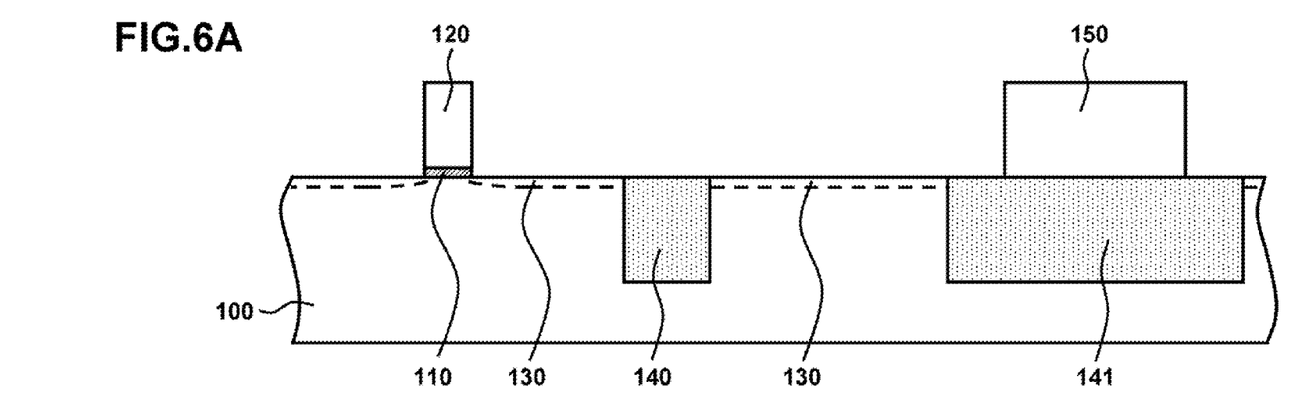
FIGS. 6A-6B are cross-sectional views illustrating a method of manufacturing an n-type MIS transistor 701 according to a second embodiment.

As in FIG. 1A, FIG. 6A illustrates the formation of a polysilicon pattern 120 and a polysilicon pattern 150 for use in the formation of a resistance element.

Figure 6B:
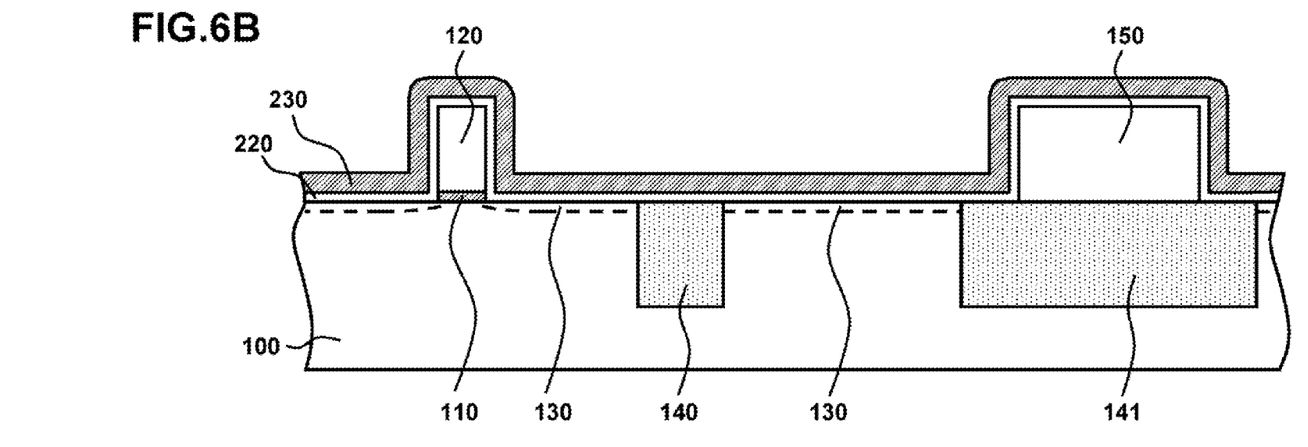

FIG. 6B illustrates the formation of a silicon oxide film 220 and a silicon nitride film 230 over the entire surface of the p-type silicon substrate 100. For example, the silicon oxide film 220 has a thickness of 10 nm, and the silicon nitride film 230 has a thickness of 20 nm. The silicon oxide film 220 and the silicon nitride film 230 may be formed by CVD.

Figure 7A:
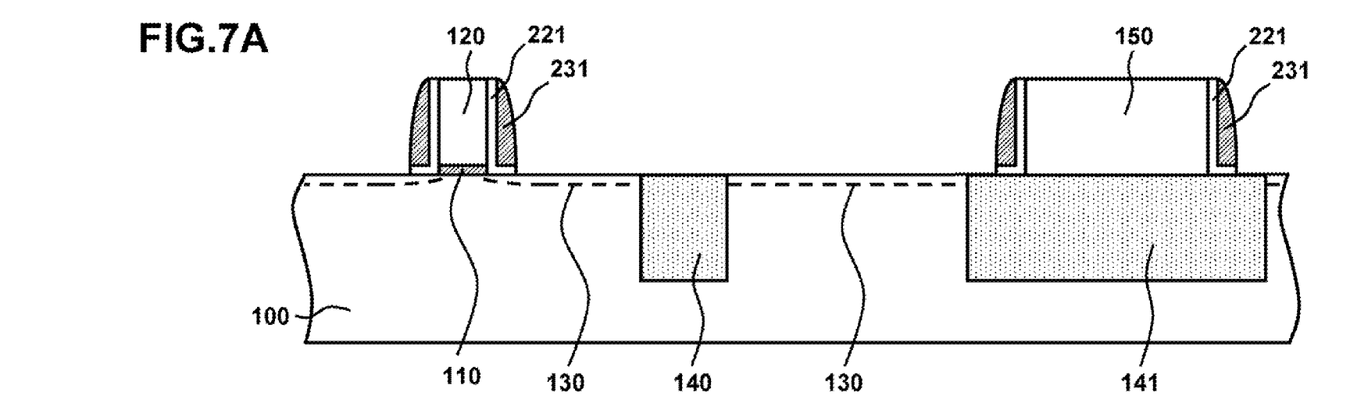
FIGS. 7A-7B are cross-sectional views illustrating a method of manufacturing an n-type MIS transistor 701 according to the second embodiment.

FIG. 7A illustrates the formation of the first sidewall spacers 221 and the second sidewall spacers 231 over the sides of the polysilicon pattern 120 and the polysilicon pattern 150. The first and second sidewall spacers 221 and 231 are formed by anisotropically etching the silicon oxide film 220 and the silicon nitride film 230. The total width of a first sidewall spacer 221 and a second sidewall spacer 231 ranges from 50 nm to 70 nm.

Figure 7B:
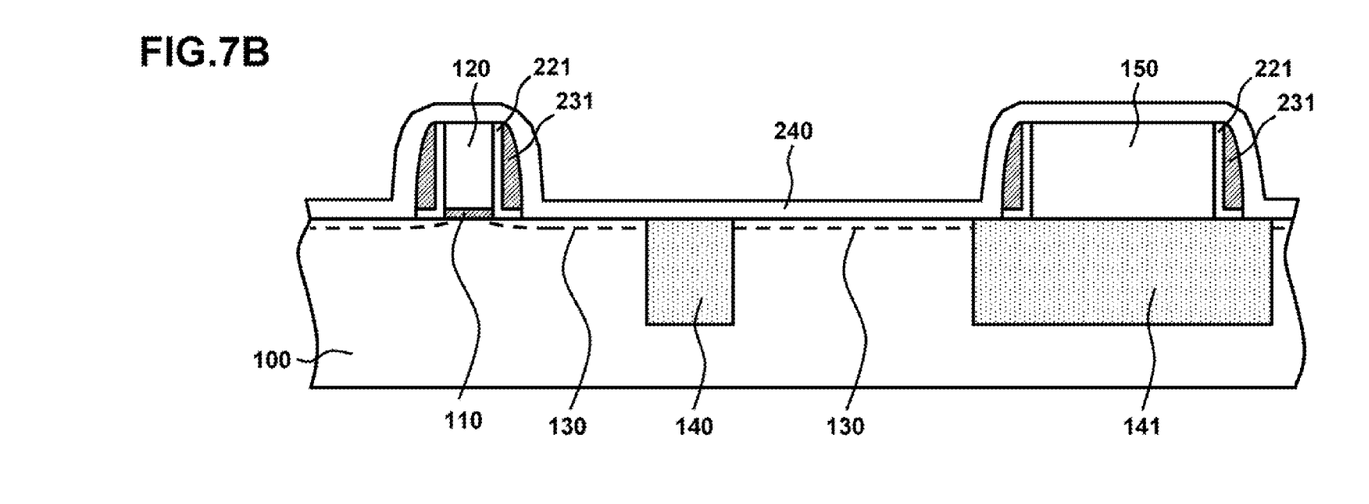

FIG. 7B illustrates the formation of a silicon oxide film 240 over the entire surface of the p-type silicon substrate 100. For example, the silicon oxide film 240 has a thickness of 20 nm. The silicon oxide film 240 may be formed by CVD.

Figure 8A:
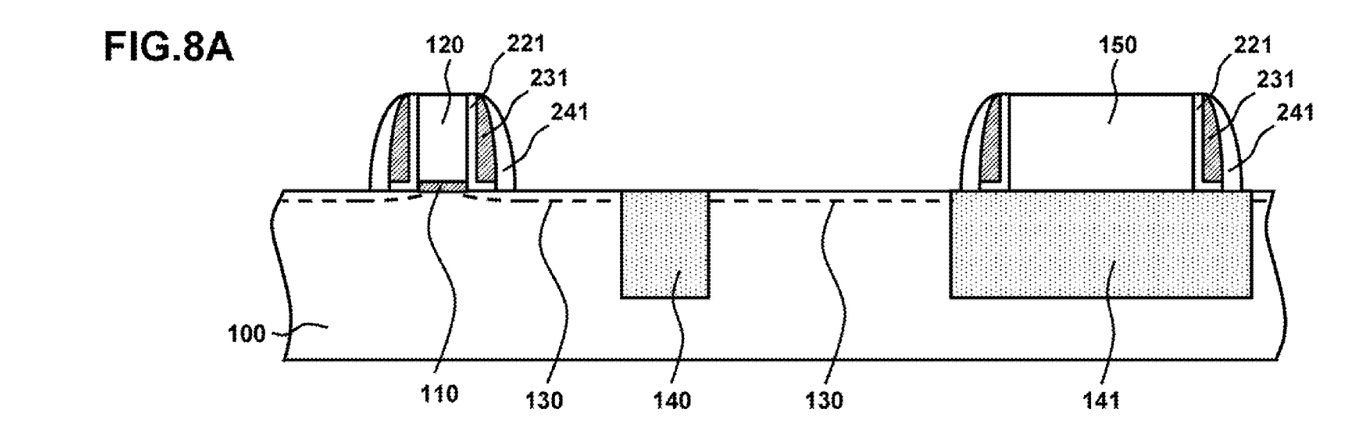
FIGS. 8A-8B are cross-sectional views illustrating a method of manufacturing an n-type MIS transistor 701 according to the second embodiment.

FIG. 8A illustrates the formation of third sidewall spacers 241 over the sides of the first sidewall spacers 221 and the second sidewall spacers 231. The third sidewall spacers 241 are formed by anisotropically etching the silicon oxide film 240. For example, the third sidewall spacers 241 have a width of 20 nm.

Figure 8B:
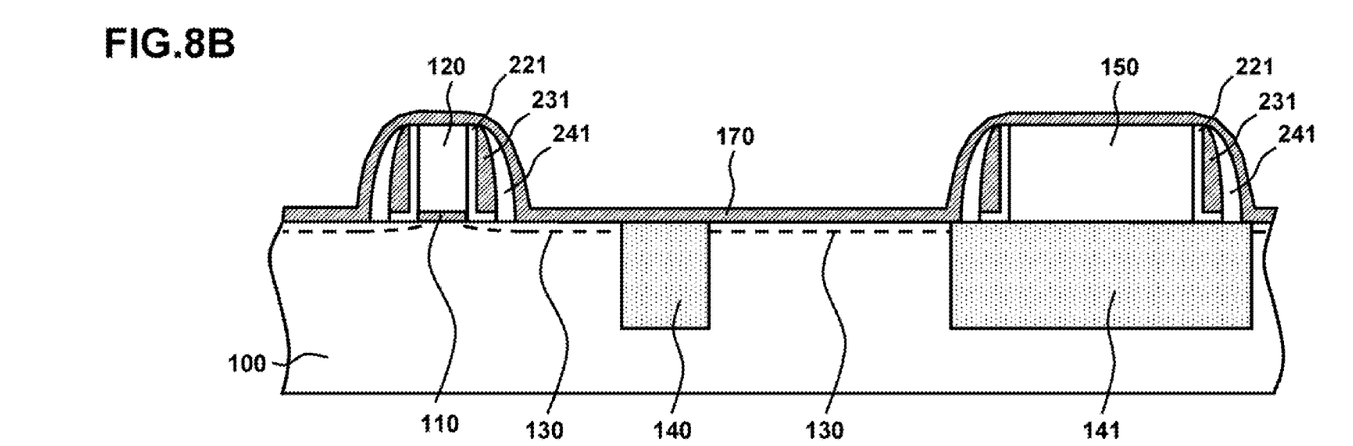

As in FIG. 1A, FIG. 8B illustrates the formation of a silicon nitride film 170 over the entire surface of the p-type silicon substrate 100. The silicon nitride film 170 serves as a protective filter layer in impurity doping.

Figure 9A:
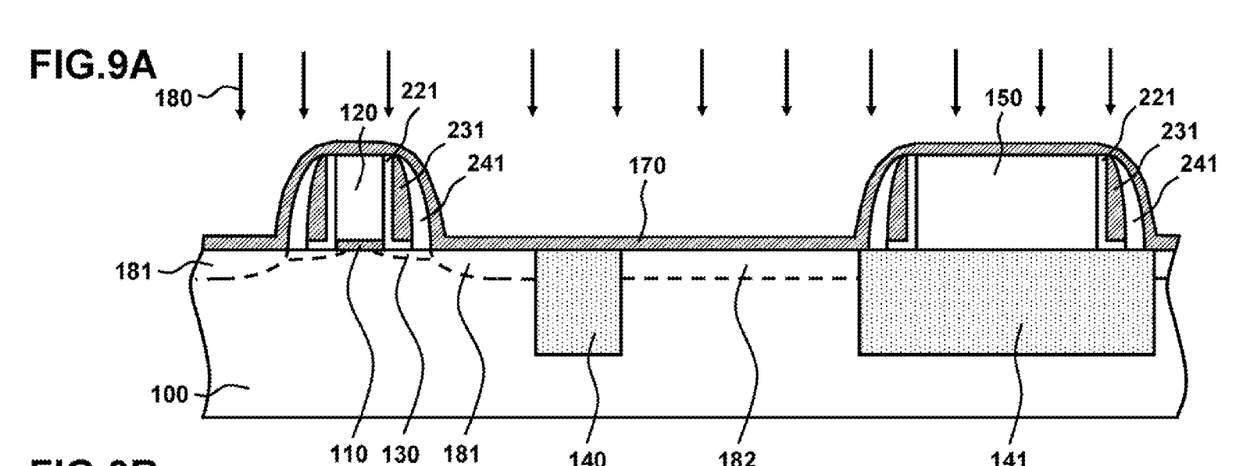
FIGS. 9A-9B are cross-sectional views illustrating a method of manufacturing an n-type MIS transistor 701 according to the second embodiment.

As in FIG. 3A, FIG. 9A illustrates the formation of impurity regions 181 and impurity regions 182 in the p-type silicon substrate 100 by ion implantation through the silicon nitride film 170. The impurity regions 181 and the impurity regions 182 are formed by implanting an n-type impurity, phosphorus or arsenic, in the p-type silicon substrate 100 using the polysilicon pattern 120, the first sidewall spacers 221, the second sidewall spacers 231, and the third sidewall spacers 241 as masks.

Figure 9B:
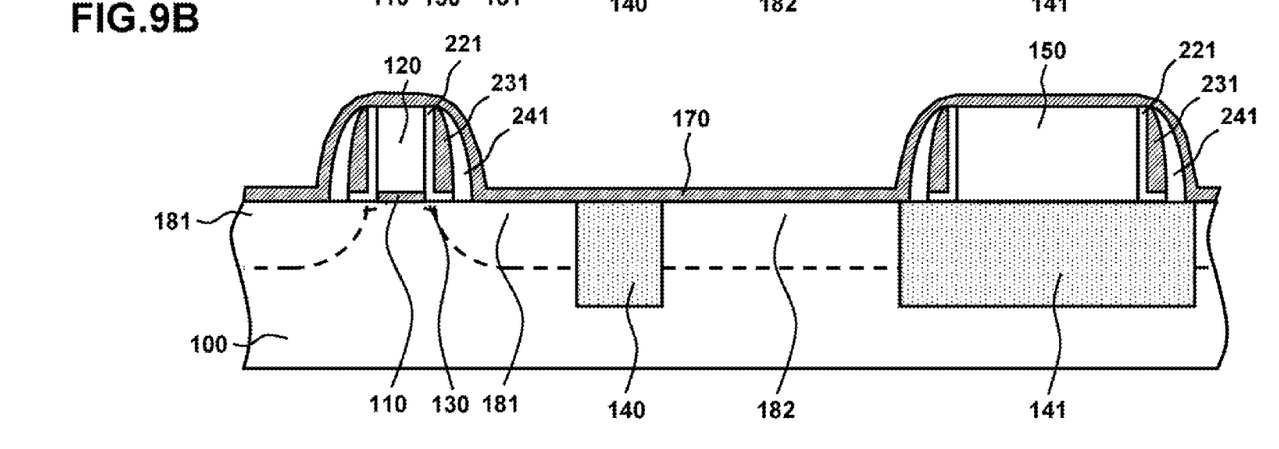

As in FIG. 3B, FIG. 9B illustrates the activation of the impurity in the impurity regions 181 and the impurity regions 182 by heat treatment for a short period of time. Preferably, the heat treatment is RTA for about 1 second except the time required for heating to and cooling from a temperature, for example, in the range of 900° C. to 1025° C.

Figure 10A:
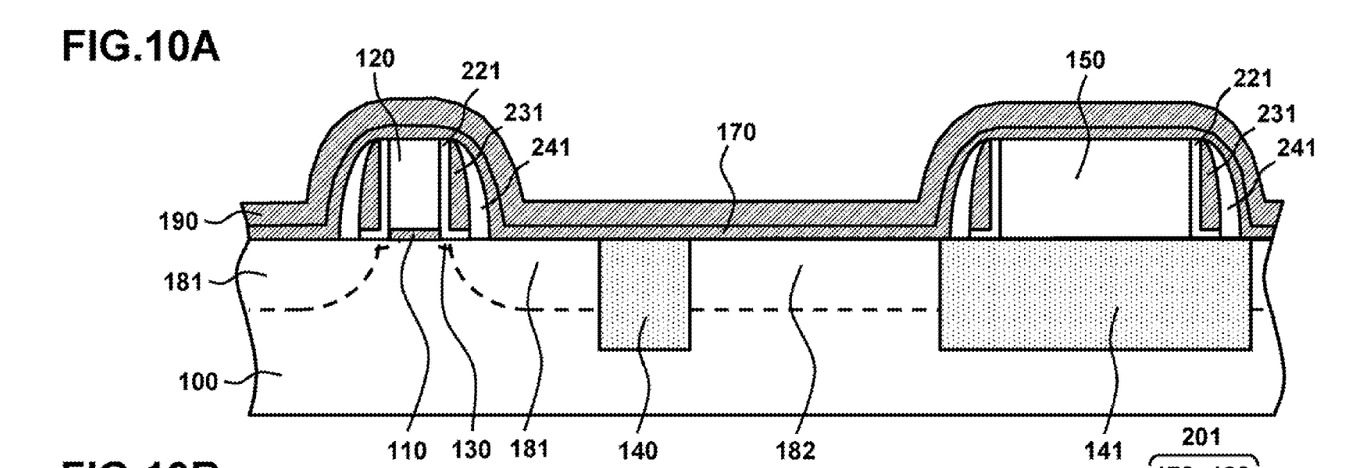
FIGS. 10A-10B are cross-sectional views illustrating a method of manufacturing an n-type MIS transistor 701 according to the second embodiment.

As in FIG. 4A, FIG. 10A illustrates the formation of a silicon nitride film 190 over the silicon nitride film 170.

Figure 10B:
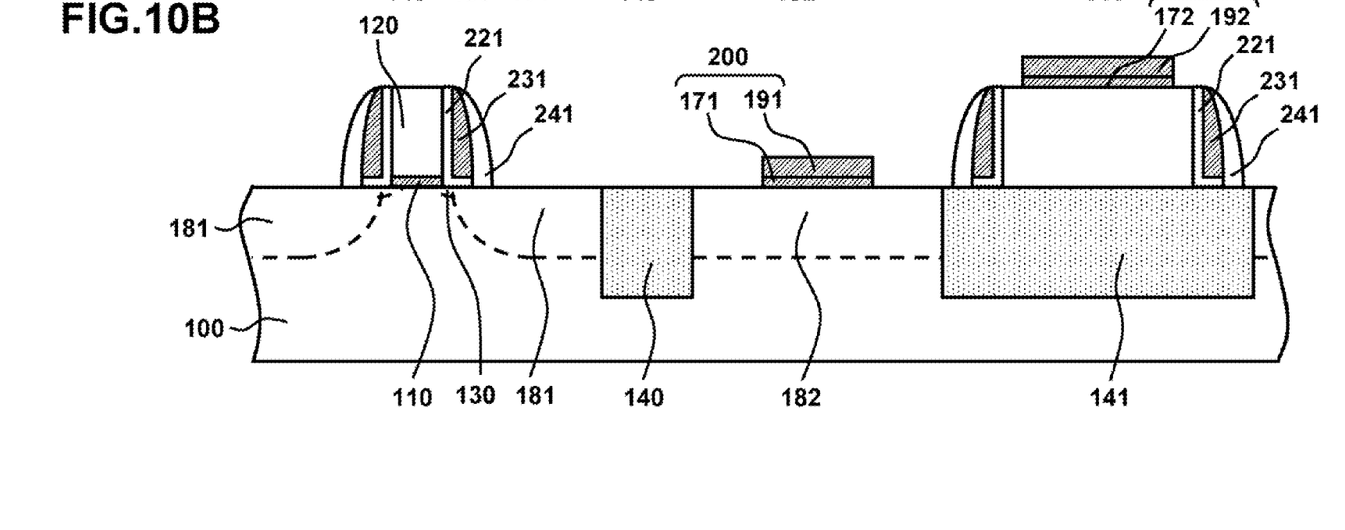

As in FIG. 4B, FIG. 10B illustrates the formation of a silicide block 200 over the resistance element region 500 in the p-type silicon substrate 100 and the formation of a silicide block 201 over the resistance element region 511 in the polysilicon pattern 150 for use in the formation of a resistance element.

Figure 11A:
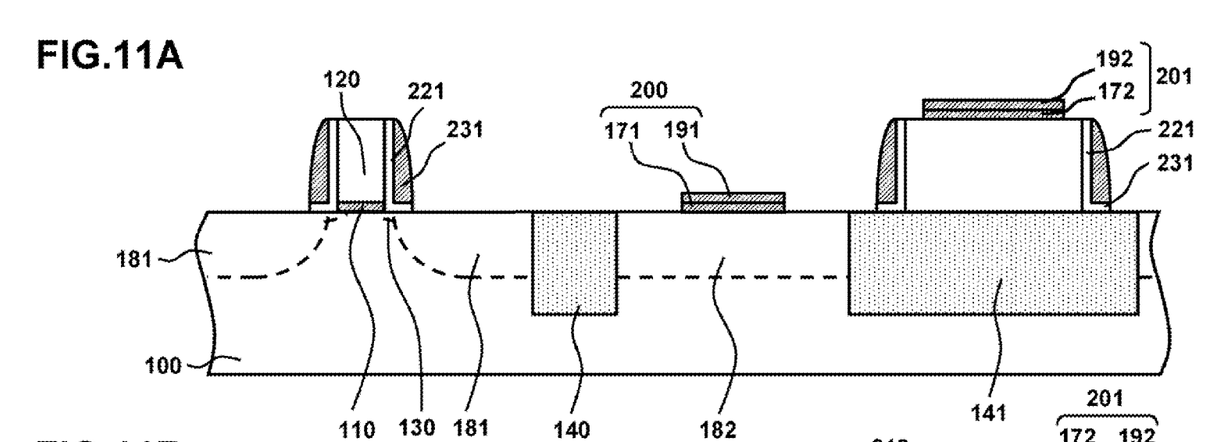
FIGS. 11A-11B are cross-sectional views illustrating a method of manufacturing an n-type MIS transistor 701 according to the second embodiment.

FIG. 11A illustrates the removal of a natural oxidation film remaining over the p-type silicon substrate 100. The surface of the p-type silicon substrate 100 is hydrogen-terminated by wet etching using a hydrofluoric acid solution. The third sidewall spacers 241, the silicide block 201, and the silicide block 202 are etched by the hydrofluoric acid solution. The third sidewall spacers 241 are removed by wet etching and thereby the second sidewall spacers 231 are exposed. For example, the thickness of the silicide block 201 and the silicide block 202 is reduced from 20 nm to 10 nm by wet etching. Thus, the first sidewall spacers 221 and the second sidewall spacers 231 remain over the sides of the polysilicon pattern 120, thereby preventing deterioration in the insulating properties of the gate electrode 120.

Figure 11B:
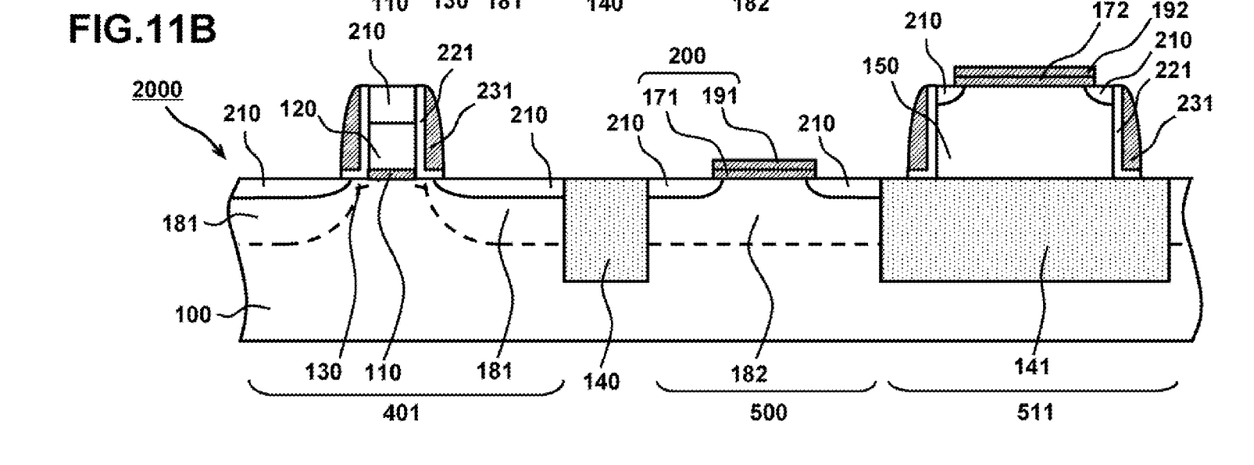

As in FIG. 5B, FIG. 11B illustrates the formation of silicide layers 210 over the polysilicon pattern 120 as the gate electrode 120, over the p-type silicon substrate 100, and over a region in which a contact region is to be formed disposed over the polysilicon pattern 150 in the resistance element region 511.

As in the first embodiment, a CESL (not illustrated), for example, formed of a silicon nitride film and an interlayer insulating film (not illustrated) are then deposited. After the interlayer insulating film is planarized, contact holes and contact plugs are formed. A wiring layer is then formed. Through these processes, the semiconductor device 701 is completed.

In the semiconductor device 701 according to the second embodiment, when the natural oxidation film remaining over the p-type silicon substrate 100 is removed by wet etching, the third sidewall spacers 241 are also removed, and the second sidewall spacers 231 are exposed. Thus, the first sidewall spacers 221 and the second sidewall spacers 231 remaining over the sides of the gate electrode 120 may maintain their thicknesses. This prevents deterioration in the insulating properties of the gate electrode 120, and therefore prevents lot-to-lot variations in the parasitic resistance of a field-effect transistor.

All examples and conditional language recited herein are intended for pedagogical purposes to aid the reader in understanding the embodiment and the concepts contributed by the inventor to furthering the art, and are to be construed as being without limitation to such specifically recited examples and conditions, nor does the organization of such examples in the specification relate to a illustrating of the superiority and inferiority of the embodiment. Although the embodiments have been described in detail, it should be understood that the various changes, substitutions, and alterations could be made hereto without departing from the spirit and scope of the invention.

What is claimed is:

1. A method of manufacturing a semiconductor device, comprising:
    forming a conductive layer over a semiconductor substrate;
    selectively removing the conductive layer for forming a resistance element and a gate electrode;
    forming sidewall spacers over sidewalls of the remaining conductive layer;
    forming a first insulating film containing a nitrogen over the semiconductor substrate having the sidewall spacers;
    implanting ions in the semiconductor substrate through the first insulating film;
    forming a second insulating film containing a nitrogen over the first insulating film after implanting ions in the semiconductor substrate through the first insulating film; and
    selectively removing the first and the second insulating film such that at least a part of the first and the second insulating films is remained over the semiconductor substrate and over the conductive layer.

2. The method according to claim 1, wherein the forming the first insulating film containing the nitrogen over the semiconductor substrate having the sidewall spacers is carried out so that a thickness of the first insulating film is formed in the range of 1 nm to 5 nm.

3. The method according to claim 1, wherein the first insulating film is formed by atomic layer deposition method.

4. The method according to claim 1, further comprising forming a silicide layer over the semiconductor substrate and over the remaining conductive layer at portions exposed by the first and the second insulating film.

5. The method according to claim 1, wherein the sidewall spacers include silicon oxide, and the first and the second insulating films include silicon nitride.

6. The method according to claim 1, wherein the forming sidewall spacers over the sidewalls of the remaining conductive layer is performed by forming first sidewall spacers over the sidewalls of the remaining conductive layer, and forming second sidewall spacers over the first sidewall spacers, the second sidewall spacers having the etching resistance property greater than the etching resistance property of the first sidewall spacers against etchant for etching the first sidewall spacers.

7. The method according to claim 6, wherein the first sidewall spacers include silicon oxide, and the second sidewall spacers include silicon nitride.

* * * * *